(12) United States Patent
Liu et al.

(10) Patent No.: US 10,255,475 B2
(45) Date of Patent: Apr. 9, 2019

(54) OPTICAL FINGERPRINT/PALMPRINT IDENTIFICATION DEVICE, TOUCH DISPLAY PANEL AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yingming Liu, Beijing (CN); Xue Dong, Beijing (CN); Xiaochuan Chen, Beijing (CN); Haisheng Wang, Beijing (CN); Xiaoliang Ding, Beijing (CN); Shengji Yang, Beijing (CN); Weijie Zhao, Beijing (CN); Lei Wang, Beijing (CN); Changfeng Li, Beijing (CN); Wei Liu, Beijing (CN); Liguang Deng, Beijing (CN); Huizhong Zhu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 79 days.

(21) Appl. No.: 15/519,834

(22) PCT Filed: Jul. 25, 2016

(86) PCT No.: PCT/CN2016/091516
§ 371 (c)(1),
(2) Date: Apr. 17, 2017

(87) PCT Pub. No.: WO2017/059725
PCT Pub. Date: Apr. 13, 2017

(65) Prior Publication Data
US 2017/0255810 A1 Sep. 7, 2017

(30) Foreign Application Priority Data

Oct. 9, 2015 (CN) .......................... 2015 1 0650090

(51) Int. Cl.
*G06K 9/00* (2006.01)
*G06F 3/042* (2006.01)
(Continued)

(52) U.S. Cl.
CPC .......... *G06K 9/0004* (2013.01); *G06F 3/042* (2013.01); *G06F 3/0412* (2013.01);
(Continued)

(58) Field of Classification Search
None
See application file for complete search history.

(56) References Cited

U.S. PATENT DOCUMENTS 8,289,285 B2 * 10/2012 Jang .................... G02F 1/13338
345/173
9,368,541 B2 * 6/2016 Kurokawa ............ G06F 3/0412
(Continued)

FOREIGN PATENT DOCUMENTS

| CN | 1689025 A | 10/2005 |
|---|---|---|
| CN | 2689025 A | 10/2005 |

(Continued)

OTHER PUBLICATIONS

First Chinese Office Action, for Chinese Patent Application No. 201510650090.3, dated Feb. 27, 2018, 22 pages.
(Continued)

*Primary Examiner* — Soo Jin Park
(74) *Attorney, Agent, or Firm* — Kinney & Lange, P.A.

(57) ABSTRACT

The present disclosure provides an optical fingerprint/palmprint identification device, and a touch display panel and a display apparatus which includes the optical fingerprint/
(Continued)

palmprint identification device, which enables easy determination of relative positions of ridges and valleys of a fingerprint/palmprint. The optical fingerprint/palmprint identification device includes: a photosensitive sensor configured for acquiring an optical signal indicative of fingerprint/palmprint information, and converting the acquired optical signal into a current; a storage capacitor configured as a separate capacitor in the optical fingerprint/palmprint identification device and electrically connected to the photosensitive sensor so as to receive and store the current from the photosensitive sensor during scanning a fingerprint/palmprint; and a switch transistor electrically connected to the storage capacitor so as to output the current stored in the storage capacitor during reading out a current.

19 Claims, 2 Drawing Sheets

(51) Int. Cl.
*G06F 3/041* (2006.01)
*H01L 27/146* (2006.01)
*G06K 9/20* (2006.01)
*H01L 27/12* (2006.01)

(52) U.S. Cl.
CPC .......... *G06F 3/0416* (2013.01); *G06K 9/209* (2013.01); *H01L 27/14612* (2013.01); *H01L 27/14623* (2013.01); *H01L 27/14678* (2013.01); *H01L 27/1255* (2013.01)

(56) References Cited

U.S. PATENT DOCUMENTS

| | | | |
|---|---|---|---|
| 9,921,670 B2* | 3/2018 | Wang | H01L 27/3227 |
| 2006/0017862 A1 | 1/2006 | Song et al. | |
| 2011/0102393 A1* | 5/2011 | Tanaka | G06F 3/0412 |
| | | | 345/207 |
| 2011/0109591 A1 | 5/2011 | Kurokawa et al. | |
| 2011/0297936 A1* | 12/2011 | Makita | H01L 27/1214 |
| | | | 257/53 |
| 2013/0069537 A1 | 3/2013 | Sun et al. | |

FOREIGN PATENT DOCUMENTS

| | | |
|---|---|---|
| CN | 102157533 A | 8/2011 |
| CN | 102597930 A | 7/2012 |
| CN | 203133800 U | 8/2013 |
| CN | 104103239 A | 10/2014 |
| CN | 104850292 A | 8/2015 |
| CN | 104881195 A | 9/2015 |
| CN | 105373772 A | 3/2016 |
| WO | 2010073892 A1 | 7/2010 |

OTHER PUBLICATIONS

International Search Report and Written Opinion dated Oct. 27, 2016, for corresponding PCT Application No. PCT/CN2016/091516.

* cited by examiner

OPTICAL FINGERPRINT/PALMPRINT IDENTIFICATION DEVICE, TOUCH DISPLAY PANEL AND DISPLAY APPARATUS

CROSS-REFERENCE TO RELATED APPLICATION

The present application claims the benefit of Chinese Patent Application No. 201510650090.3, entitled "Optical Fingerprint/Palmprint Identification Device, Touch Display Panel and Display Apparatus" and filed on Oct. 9, 2015 with the State Intellectual Property Office of China, the entire disclosures of which are incorporated herein by reference.

BACKGROUND

Technical Field

Embodiments of the present disclosure generally relate to the field of touch display technology, and particularly, to an optical fingerprint/palmprint identification device, and, a touch display panel and a display apparatus including the identification device.

Description of the Related Art

Fingerprint or palmprint is innately and uniquely identification features of a human body distinguishing from others. Print line features, such as ridge lines and valley lines, are its most important ones, and include a series of ridges and valleys on a skin surface of a finger or palm. Fingerprint or palmprint identification technology owns advantages such as high accuracy, fast speed, low cost, great user acceptance and the like, and is applied progressively onto field of personal identity verification.

Optical fingerprint or palmprint identification technology is mainly based on principle of refraction and reflection of light. When a surface of a touch screen of a display apparatus is pressed by a finger or palm, rugged print lines of the finger or the palm is irradiated by a built-in light source of the display apparatus. Because of different angles at which light is refracted at convex points and concave points of the lines and different intensities of the reflected light, the light projected onto a photosensitive sensor will generate different currents. By detecting the currents, positions of the ridges and valleys of the fingerprint or palmprint are identified. Ridge lines and valley lines are displayed using different colors, so that a fingerprint or palmprint image can be achieved.

In theory, it is able to distinguish absolute positions of the ridges and valleys of the fingerprint or palmprint, as long as the photosensitive sensor is sensitive enough. However, in practical operations, it is difficult to distinguish the ridges and valleys from each other as values of the currents generated by the ridges and valleys are smaller.

SUMMARY

In order to overcome at least one of the abovementioned and other problems and defects existing in prior arts, the present invention is made.

In accordance with one aspect of the present disclosure, there is provided an optical fingerprint/palmprint identification device, comprising: a photosensitive sensor configured for acquiring an optical signal indicative of fingerprint/palmprint information, and converting the acquired optical signal into a current; a storage capacitor configured as a separate capacitor in the optical fingerprint/palmprint identification device and electrically connected to the photosensitive sensor so as to receive and store the current from the photosensitive sensor during scanning a fingerprint/palmprint; and a switch transistor electrically connected to the storage capacitor so as to output the current stored in the storage capacitor during reading out a current.

In one embodiment, the photosensitive sensor may comprise a photosensitive diode comprising a first electrode layer, a photosensitive material layer and a second electrode layer stacked in sequence from bottom to top; and the first electrode layer is electrically connected to the storage capacitor, the photosensitive material layer is configured to generate current carriers when irradiated by light reflected by the fingerprint/palmprint, and the second electrode layer is made of a transparent material or has a transparent structure and is electrically connected to a fixed voltage source.

In one embodiment, the storage capacitor may comprise a first capacitor formed by a third electrode layer, a first insulation layer and a connection electrode layer stacked in sequence from bottom to top, the third electrode layer being grounded, the connection electrode layer being connected to the photosensitive sensor.

In one embodiment, the connection electrode layer and the first electrode layer are formed into one piece.

In one embodiment, the storage capacitor may further comprise a second capacitor formed by a fourth electrode layer, a second insulation layer and the third electrode layer stacked in sequence from bottom to top, and the fourth electrode layer is connected to the connection electrode layer so that the first capacitor and the second capacitor are in parallel connection.

In one embodiment, the switch transistor may comprise a thin-film transistor having a source electrode electrically connected to the connection electrode layer.

In one embodiment, the abovementioned optical fingerprint/palmprint identification device may further comprise a planarization layer covering the thin-film transistor and a through hole passing through the first insulation layer, the second insulation layer and the planarization layer to expose a portion of the source electrode, the fourth electrode layer is formed on the planarization layer, and the connection electrode layer and the fourth electrode layer contact each other at the through hole and come into contact with the exposed portion of the source electrode.

In one embodiment, the abovementioned optical fingerprint/palmprint identification device may further comprise a light-shielding layer configured for shielding back light so as to avoid the back light from being irradiated onto photosensitive sensor.

In accordance with another aspect of the present disclosure, there is provided a touch display panel, comprising: a plurality of pixels; and one or more abovementioned optical fingerprint/palmprint identification devices disposed in corresponding one of the pixels.

In one embodiment, one of the optical fingerprint/palmprint identification devices may be disposed in each of the pixels, or, two adjacent ones of the optical fingerprint/palmprint identification devices are separated by one or more of the pixels.

In accordance with still another aspect of the present disclosure, there is provided a display apparatus comprising the abovementioned touch display panel.

These and/or other objects and advantages of the present disclosure will become apparent and more readily appreciated from the following description of the present disclosure, taken in conjunction with the accompanying drawings and providing a complete understanding of the present disclosure.

BRIEF DESCRIPTION OF THE DRAWINGS

Features and advantages of the present disclosure will more clearly appreciated by referring to the accompanying drawings. These accompanying drawings are illustrative and should not be construed as bringing any limitations on the present disclosure. In drawings.

DETAILED DESCRIPTION OF THE EMBODIMENTS

Figure 1:
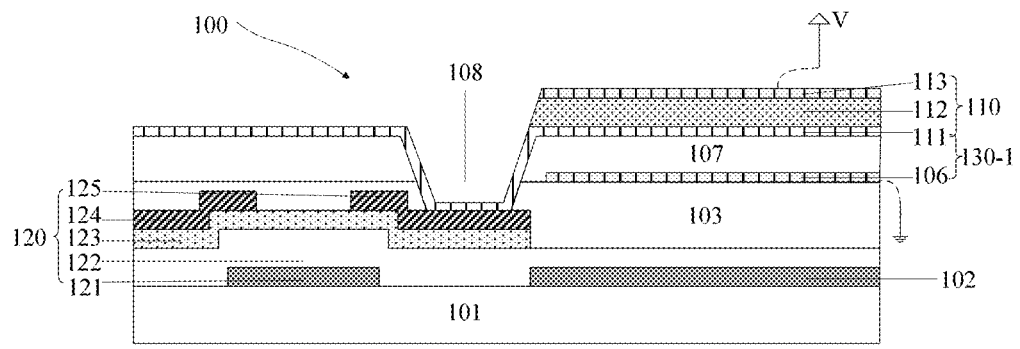
FIG. 1 is a cross-sectional view illustrating a structure of an optical fingerprint/palmprint identification device according to one exemplary embodiment of the present disclosure.

Embodiments of the present disclosure will be described hereinafter in detail with reference to the attached drawings. In this description, the same or like reference numerals refer to the same or like elements. Explanations and interpretations of these embodiments of the present disclosure aim to illustrate a general concept of the present disclosure, and should not be understood as limiting the present disclosure.

According to a general inventive concept of the present disclosure, there is provided an optical fingerprint/palmprint identification device, comprising: a photosensitive sensor configured for acquiring an optical signal indicative of fingerprint/palmprint information, and converting the acquired optical signal into a current; a storage capacitor configured as a separate capacitor in the optical fingerprint/palmprint identification device and electrically connected to the photosensitive sensor so as to receive and store the current from the photosensitive sensor during scanning a fingerprint/palmprint; and a switch transistor electrically connected to the storage capacitor so as to output the current stored in the storage capacitor during reading out a current. In this optical fingerprint/palmprint identification device, a separate storage capacitor is provided to store the current generated in the photosensitive sensor from light reflected by a fingerprint/palmprint during scanning the fingerprint/palmprint. After accumulation of current within a certain time, a current having relatively great value or amplitude can be obtained, so that there is a relatively great difference between the currents caused by valleys and ridges of the fingerprint/palmprint, thereby enabling distinguishing relative positions of the valleys and ridges. It should be noted that in embodiments of the present disclosure, the storage capacitor is separately or purposely provided in the optical fingerprint/palmprint identification device, and is not any parasitic capacitor formed by other structures/layers of the optical fingerprint/palmprint identification device.

In addition, in the following detailed description, in order to facilitate the description, lots of details are illustrated so as to provide a complete understanding of embodiments of the present disclosure. However, it is obvious that one or more embodiments can be implemented without involving these details. In other circumstances, well-known structures and devices are shown in brief, to simplify the drawings.

FIG. 1 illustrates a structure of an optical fingerprint/palmprint identification device according to one exemplary embodiment of the present disclosure. As shown, an optical fingerprint/palmprint identification device 100 comprises a photosensitive diode 110 serving as the photosensitive sensor, a thin-film transistor 120 serving as the switch transistor, and a storage capacitor 130-1. It can be understood that, other forms of photosensitive sensors or photoelectric converters can be also adopted, and, herein the photosensitive diode is only taken as an example for the description. The photosensitive diode 110 receives light reflected from a finger/palm of a user and generates a current during scanning a fingerprint/palmprint. Amplitude of the current corresponds to intensity of the reflected light, while the intensity of the reflected light is related to characteristic of the fingerprint/palmprint, so that the generated current can indicate characteristic information of the fingerprint/palmprint, such as ridge lines and valley lines. The separate storage capacitor receives and stores the current generated in the photosensitive sensor 110 during scanning the fingerprint/palmprint. After accumulation of current within a certain time, a current having a relatively great value or amplitude the can be obtained, so that there is a relatively great difference between currents generated due to valleys and ridges of the fingerprint/palmprint, thereby easily distinguishing relative positions of the valleys and ridges. During reading out a current, the thin-film transistor 120 is switched on under the control of a control line (not shown), so as to output the current stored in the storage capacitor to a read line (not shown). The read-out current is processed so that data indicative of characteristics of the fingerprint/palmprint can be extracted. Finally, relative positions of the valleys and ridges can be determined and/or fingerprint/palmprint patterns can be obtained. These processing and extraction of characteristics can be achieved using conventional technology, which will not be described herein.

In the embodiment shown in FIG. 1, the thin-film transistor 120 is a bottom gate type transistor and comprises a gate 121, a gate insulation layer 122, an active layer 123, and a drain electrode 124 and a source electrode 125 formed in sequence on a substrate 101. It can be understood that, the thin-film transistor 120 serving as the switch transistor can also be a top gate type thin-film transistor, of which the specific configuration is obvious for those skilled in the art and accordingly the detailed description thereof is omitted herein.

As shown in FIG. 1, a planarization layer 103 is formed on the substrate 101 so as to cover the thin-film transistor 120. A third electrode layer 106, a first insulation layer 107, a first electrode layer 111, a photosensitive material layer 112 and a second electrode layer 113 are formed on the planarization layer 103 in sequence from bottom to top. In an example, the third electrode layer 106, the first insulation layer 107 and the first electrode layer 111 form the first capacitor 130-1 serving as the storage capacitor. The first electrode layer 111, the photosensitive material layer 112 and the second electrode layer 113 form the photosensitive diode 110. That is, the first capacitor 130-1 and the photosensitive diode 110 share the electrode layer 111, so that the capacitor 130-1 is electrically connected to the photosensitive diode 110 and receives the current from the photosensitive diode 110. It can be understood that, in other embodiments, no electrode is shared between the capacitor 130-1 and the photosensitive diode 110, and, two electrode layers of the capacitor 130-1 and the photosensitive diode 110 can be electrically connected to each other through a wire or conductive material layer.

Figure 2:
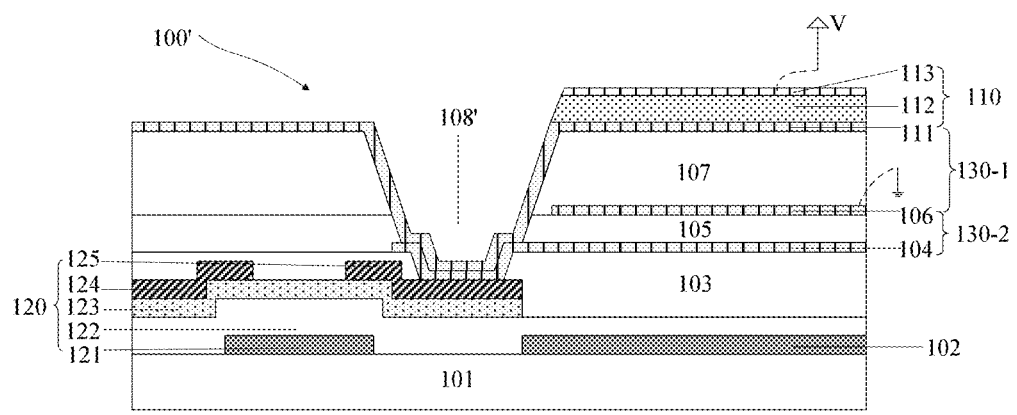
FIG. 2 is a cross-sectional view illustrating a structure of an optical fingerprint/palmprint identification device according to another exemplary embodiment of the present disclosure.

FIG. 2 illustrates a structure of an optical fingerprint/palmprint identification device according to another exemplary embodiment of the present disclosure. As shown, an optical fingerprint/palmprint identification device 100' comprises a photosensitive diode 110 serving as the photosensitive sensor, a thin-film transistor 120 serving as the switch transistor, and storage capacitors 130-1 and 130-2. In this embodiment, the two capacitors 130-1 and 130-2 in parallel connection form a relatively great storage capacitor.

Specifically, as shown in FIG. 2, a planarization layer 103 is formed on the substrate 101 so as to cover the thin-film transistor 120. A fourth electrode layer 104, a second insulation layer 105, a third electrode layer 106, a first insulation layer 107, a first electrode layer 111, a photosensitive material layer 112 and a second electrode layer 113 are formed on the planarization layer 103 in sequence from bottom to top. In an example, the third electrode layer 106, the first insulation layer 107 and the first electrode layer 111 form the first capacitor 130-1 serving as the storage capacitor, the fourth electrode layer 104, the second insulation layer 105 and the third electrode layer 106 form the second capacitor 130-2 serving as the storage capacitor. That is, the first capacitor 130-1 and the second capacitor 130-2 share the third electrode layer 106. The first electrode layer 111, the photosensitive material layer 112 and the second electrode layer 113 form the photosensitive diode 110. It can be understood that, in other embodiments, no electrode is shared between the capacitors 130-1 and 130-2, and, two electrode layers of the two capacitors can be electrically connected to each other through a wire or conductive material layer.

It can be understood that, although not shown, in other embodiments, one or more other insulation material layers, such as a passivation layer, can be provided, between the third electrode layer 106 and the planarization layer 103 (see FIG. 1), or between the fourth electrode layer 104 and the planarization layer 103 (see FIG. 1).

In an embodiment of the present disclosure, the fourth electrode layer 104, the third electrode layer 106 and the first electrode layer 111 may be made of suitable conductive materials, such as ITO or metal. The photosensitive material layer 112 may be selected from a semi-conductor material, such as α-Si or polycrystalline silicon; of course, other photosensitive materials, such as PbS and the like, can be adopted and it is not limited herein. In one example, the second electrode layer 113 is made of a transparent conductive material such as ITO material or the like. Alternatively, the second electrode layer 113 may have a transparent structure, for example, including metal wires or grid structure. As a result, light reflected by a fingertip/palm of a user can passes through the second electrode layer 113 and enters the photosensitive material layer 112, so that photoelectric conversion is made in the photosensitive material layer 112 so as to generate a current.

In an embodiment of the present disclosure, the second electrode layer 113 is electrically connected to a fixed voltage source V, while the third electrode layer 106 is grounded. In addition, in FIG. 1, the first electrode layer 111, for example, passes through a through hole 108 passing through the first insulation layer 107 and the planarization layer 103 and electrically contacts the source electrode 125 of the thin-film transistor 120. In FIG. 2, a through hole 108' passes through the first insulation layer 107, the second insulation layer 105 and the planarization layer 103 to expose a portion of the source electrode 125, the fourth electrode layer 104 is formed on the planarization layer 103, the first electrode layer 111 and the fourth electrode layer 104 contacts (are stacked with) each other at the through hole 108' and come into contact with the exposed portion of the source electrode 125. As a result, the capacitors 130-1 and 130-2 are electrically connected to the photosensitive diode 110 and receive the current from the photosensitive diode 110, and further are electrically connected to the switch transistor 120, so that if necessary, the current generated in the photosensitive diode 110 and/or electric charges/the current stored in the capacitors 130-1 and 130-2 is read out or outputted via the switch transistor 120.

As a result, when no light reflected by the fingertip/palm is irradiated onto the photosensitive material layer 112, the second electrode layer 113 has on a fixed electric potential, and a total amount of charges stored in the capacitor between first electrode layer 111 and the third electrode layer 106 is Q0. When light reflected by valleys of the fingerprint/palmprint is irradiated onto the photosensitive material layer 112, current carriers are generated in the photosensitive material layer 112, that is, the resistance of the photosensitive material layer become small, and at this time, with a fixed electric voltage, a current is generated and is stored in the capacitor 130-1. Within a certain time, the total amount of charges stored in the capacitor between the first electrode layer 111 and the third electrode layer 106 becomes Q1, here, Q1>Q0. For similar reasons, when light reflected by ridges of the fingerprint/palmprint is irradiated onto the photosensitive material layer 112, more current carriers are generated in the photosensitive material layer 112, and the resistance of the photosensitive material layer also become small, but is different from the resistance in case of the valleys, and at this time, with a fixed electric voltage, a different current is generated and is stored in the capacitor 130-1. Within a certain time, the total amount of charges stored in the capacitor between the first electrode layer 111 and the third electrode layer 106 becomes Q2, here, Q2>Q0 and Q2≠Q1. As a result, within a certain time, for example, during a fingerprint/palmprint scanning period, a small difference between the valleys and the ridges can be distinguished easily by means of accumulating amount of charges/the current (the amount of charges will be converted into a corresponding detectable current signal), generated in photosensitive material layer from the light reflected by the valleys and the ridges of the fingerprint/palmprint. Relative positions of the valleys and the ridges can be determined by means of a difference Q2−Q1 between the amount of charges/the currents, generated in photosensitive material layer from the light reflected by the valleys and the ridges. For example, when this difference or its absolute value goes beyond a threshold, it can be determined that the valleys and the ridges are presented at the corresponding positions, and a feature corresponding to a relatively great current value is identified as the ridge and a feature corresponding to a relatively small current value is identified as the valley.

In the embodiment shown in FIGS. 1 and 2, a light-shielding layer 102 may be provided at one side of the planarization layer 103 away from the photosensitive sensor 110, for example, at a position of the substrate 101 corresponding to the photosensitive sensor 110, and it shields light which enters the identification device from the substrate 101, so as to prevent the photosensitive sensor 110 from being adversely suffered from ambient light.

Figure 3:
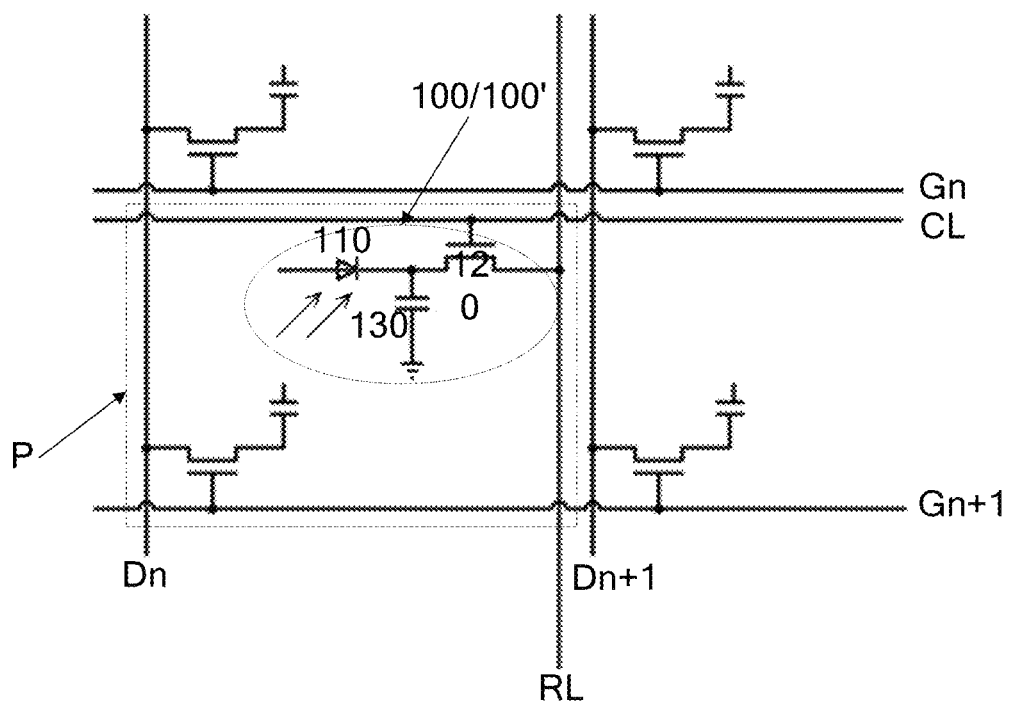
FIG. 3 is an illustrative schematic view of a touch display panel including an optical fingerprint/palmprint identification device according to the present disclosure.

In a further exemplary embodiment of the present disclosure, there is also provided a touch display panel. As shown in FIG. 3, it comprises a plurality of pixels P defined by gate control lines G (G1 . . . Gn, Gn+1, where n is an integer that is greater than or equal to one) and data lines D (D1 . . . Dn, Dn+1), and, one or more abovementioned optical fingerprint/palmprint identification devices can be disposed in corresponding pixels. As a result, a touch display panel with both a display function and a fingerprint/palmprint identification function is provided. For example, one optical fingerprint/palmprint identification device is disposed in each of the pixels; or, two adjacent optical fingerprint/palmprint identification devices are separated by one or more pixels, as long as main characteristics of the fingerprint/palmprint can be sensed. As a result, excessive reduction of the opening ratio is avoided. In one example, this touch display panel can be an in-cell touch screen. In another example, the abovementioned electrode layer 104 can also be served as a pixel electrode, or is formed by the same material layer as the pixel electrode; and, the abovementioned electrode layer 111 can also be served as a common electrode, or is formed by the same material layer as the common electrode; and these are not limited herein.

In this touch display panel, during scanning a fingerprint/palmprint, the photosensitive sensor 110 receives light reflected by a fingertip/palm of a user and generates an optical signal indicative of fingerprint/palmprint characteristic information. The storage capacitor 130 receives and stores the optical signal generated in the photosensitive sensor 110, and a relative great value or amplitude of current can be obtained after accumulation of current within a certain time. During reading out or outputting a current, the switch transistor 120 is switched on under the control of a fingerprint/palmprint touch scanning line CL, so as to output the current stored in the storage capacitor 130 to a read line RL. In one example, comparison is implemented between the identification signals read from adjacent read lines of the optical fingerprint/palmprint identification device, and a signal difference is amplified, so that relative positions of the valleys and ridges of the fingerprint/palmprint can be determined.

In the example shown in FIG. 3, the fingerprint/palmprint touch scanning line CL is disposed, independent of the gate control lines G, between adjacent pixels. Alternatively, one or more gate control lines of the touch display panel may be used as corresponding fingerprint/palmprint touch scanning lines. In another example, the fingerprint/palmprint reading line can be disposed, independent of the touch driving signal lines (not shown) of the touch display panel, between adjacent pixels. Alternatively, one or more touch driving signal lines of the touch display panel may be used as corresponding fingerprint/palmprint reading lines. In this case, during identification of fingerprint/palmprint, the touch driving signal line may be used as a fingerprint/palmprint reading line, and during the touch period, the fingerprint/palmprint reading line may be used as a touch driving signal line.

In yet another exemplary embodiment of the present disclosure, there is also provided a display apparatus comprising the abovementioned touch display panel. The display apparatus can be a mobile phone, a tablet computer, a display, a digital photo frame, a navigating instrument, an identity recognition apparatus or any products or components having a display function.

Although these embodiments of the present disclosure have been shown and described, it would be appreciated by those skilled in the art that various changes or modifications may be made in these embodiments without departing from the principles and spirit of the present disclosure, the scope of which is defined in the claims and their equivalents.

What is claimed is:

1. An optical fingerprint/palmprint identification device, comprising:
   a photosensitive sensor configured for acquiring an optical signal indicative of fingerprint/palmprint information, and converting the acquired optical signal into a current;
   a storage capacitor configured as a separate capacitor in the optical fingerprint/palmprint identification device and electrically connected to the photosensitive sensor so as to receive and store the current from the photosensitive sensor during scanning a fingerprint/palmprint; and
   a switch transistor electrically connected to the storage capacitor so as to output the current stored in the storage capacitor during reading out a current;
   wherein the photosensitive sensor comprises a photosensitive diode comprising a first electrode layer, a photosensitive material layer and a second electrode layer stacked in sequence from bottom to top; and
   wherein the first electrode layer is electrically connected to the storage capacitor, the photosensitive material layer is configured to generate current carriers when irradiated by light reflected by the fingerprint/palmprint, and the second electrode layer is made of transparent material or has a transparent structure and is electrically connected to a fixed voltage source.

2. The optical fingerprint/palmprint identification device of claim 1, wherein
   the storage capacitor comprises a first capacitor formed by a third electrode layer, a first insulation layer and a connection electrode layer stacked in sequence from bottom to top, the third electrode layer being grounded, the connection electrode layer being connected to the photosensitive sensor.

3. The optical fingerprint/palmprint identification device of claim 2, wherein the connection electrode layer and the first electrode layer are formed into one piece.

4. The optical fingerprint/palmprint identification device of claim 2, wherein, the storage capacitor further comprises a second capacitor formed by a fourth electrode layer, a second insulation layer and the third electrode layer stacked in sequence from bottom to top, and the fourth electrode layer is connected to the connection electrode layer so that the first capacitor and the second capacitor are in parallel connection.

5. A touch display panel, comprising:
   a plurality of pixels; and
   one or more optical fingerprint/palmprint identification devices of claim 4, disposed in corresponding ones of the plurality of pixels.

6. A display apparatus, comprising the touch display panel of claim 5.

7. The optical fingerprint/palmprint identification device of claim 2, wherein the switch transistor comprises a thin-film transistor having a source electrode electrically connected to the connection electrode layer.

8. The optical fingerprint/palmprint identification device of claim 7, wherein,
   the optical fingerprint/palmprint identification device further comprises a planarization layer covering the thin-film transistor and a through hole passing through the first insulation layer and the planarization layer to expose a portion of the source electrode.

9. A touch display panel, comprising:
   a plurality of pixels; and
   one or more said optical fingerprint/palmprint identification devices of claim 8, disposed in corresponding ones of the plurality of pixels.

10. The optical fingerprint/palmprint identification device of claim 1, further comprising a light-shielding layer configured for shielding back light so as to avoid the back light from being irradiated onto photosensitive sensor.

11. A touch display panel, comprising:
a plurality of pixels; and
one or more said optical fingerprint/palmprint identification devices of claim 1, disposed in corresponding ones of the pixels.

12. The touch display panel of claim 11, wherein, one of the optical fingerprint/palmprint identification devices is disposed in each of the pixels, or, two adjacent ones of the optical fingerprint/palmprint identification devices are separated by one or more of the pixels.

13. A display apparatus, comprising the touch display panel of claim 11.

14. An optical fingerprint/palmprint identification device, comprising:
a photosensitive sensor configured for acquiring an optical signal indicative of fingerprint/palmprint information, and converting the acquired optical signal into a current;
a storage capacitor configured as a separate capacitor in the optical fingerprint/palmprint identification device and electrically connected to the photosensitive sensor so as to receive and store the current from the photosensitive sensor during scanning a fingerprint/palmprint; and
a switch transistor electrically connected to the storage capacitor so as to output the current stored in the storage capacitor during reading out a current;
wherein the storage capacitor comprises a first capacitor formed by a third electrode layer, a first insulation layer and a connection electrode layer stacked in sequence from bottom to top, the third electrode layer being grounded, the connection electrode layer being connected to the photosensitive sensor.

15. The optical fingerprint/palmprint identification device of claim 14, wherein the storage capacitor further comprises a second capacitor formed by a fourth electrode layer, a second insulation layer and the third electrode layer stacked in sequence from bottom to top, and the fourth electrode layer is connected to the connection electrode layer so that the first capacitor and the second capacitor are in parallel connection.

16. The optical fingerprint/palmprint identification device of claim 15, wherein the switch transistor comprises a thin-film transistor having a source electrode electrically connected to the connection electrode layer.

17. The optical fingerprint/palmprint identification device of claim 16, wherein the optical fingerprint/palmprint identification device further comprises a planarization layer covering the thin-film transistor and a through hole passing through the first insulation layer, the second insulation layer and the planarization layer to expose a portion of the source electrode, and
wherein the fourth electrode layer is formed on the planarization layer, and the connection electrode layer and the fourth electrode layer contact each other at the through hole and come into contact with the exposed portion of the source electrode.

18. The optical fingerprint/palmprint identification device of claim 14, wherein the storage capacitor further comprises a second capacitor formed by a fourth electrode layer, a second insulation layer and the third electrode layer stacked in sequence from bottom to top, and the fourth electrode layer is connected to the connection electrode layer so that the first capacitor and the second capacitor are in parallel connection.

19. The optical fingerprint/palmprint identification device of claim 14, further comprising a light-shielding layer configured for shielding back light so as to avoid the back light from being irradiated onto photosensitive sensor.

* * * * *